US012494172B2

(12) United States Patent
Lee et al.

(10) Patent No.: US 12,494,172 B2
(45) Date of Patent: Dec. 9, 2025

(54) PIXEL CIRCUIT AND DISPLAY DEVICE INCLUDING SAME

(71) Applicant: LG Display Co., Ltd., Seoul (KR)

(72) Inventors: Young Joon Lee, Paju-si (KR); Woo Kyu Sang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/916,510

(22) Filed: Oct. 15, 2024

(65) Prior Publication Data

US 2025/0182692 A1 Jun. 5, 2025

(30) Foreign Application Priority Data

Dec. 1, 2023 (KR) ........................ 10-2023-0172215

(51) Int. Cl.

*G09G 3/3233* (2016.01)
*G09G 3/20* (2006.01)
*H10K 59/131* (2023.01)

(52) U.S. Cl.

CPC ......... *G09G 3/3233* (2013.01); *G09G 3/2096* (2013.01); *G09G 2300/0819* (2013.01); *G09G 2300/0842* (2013.01); *G09G 2310/08* (2013.01); *G09G 2320/0247* (2013.01); *G09G 2320/0252* (2013.01); *G09G 2330/021* (2013.01); *H10K 59/131* (2023.02)

(58) Field of Classification Search

CPC .......... G09G 3/3233; G09G 3/30; G09G 3/32; G09G 3/3208; G09G 3/3255

See application file for complete search history.

(56) References Cited

U.S. PATENT DOCUMENTS 11,594,169 B2 2/2023 Kim et al.
11,929,024 B2 3/2024 Kim et al.
2019/0130833 A1* 5/2019 Gao ..................... G09G 3/3233
2022/0199016 A1 6/2022 Kim et al.
2022/0208075 A1 6/2022 Kim et al.

FOREIGN PATENT DOCUMENTS

KR 10-2022-0088132 A 6/2022
KR 10-2022-0094916 A 7/2022
KR 10-2023-0075010 A 5/2023

* cited by examiner

*Primary Examiner* — Kevin M Nguyen
(74) *Attorney, Agent, or Firm* — Fenwick & West LLP

(57) ABSTRACT

A pixel circuit of a display device presented herein includes a driving element including a first electrode connected to a first node, a gate electrode connected to a second node, and a second electrode connected to a third node; a first switch element connecting the second node to the third node; a second switch element applying a data voltage to the first node; a third switch element connecting a pixel driving voltage line to the first node; a fourth switch element connecting the third node to a fourth node; a fifth switch element applying a first initialization voltage to the second node; a sixth switch element applying a second initialization voltage to the fourth node; a capacitor connected to the pixel driving voltage line and the second node; and a light-emitting element connected to the fourth node and a low potential power voltage line.

6 Claims, 21 Drawing Sheets

PIXEL CIRCUIT AND DISPLAY DEVICE INCLUDING SAME

CROSS-REFERENCE TO RELATED APPLICATION

This application claims priority from Republic of Korea Patent Application No. 10-2023-0172215, filed on Dec. 1, 2023, which is hereby incorporated by reference in its entirety.

BACKGROUND

Field

The present disclosure relates to a pixel circuit and a display device including the same.

Discussion of Related Art

Electroluminescent display devices are divided into inorganic light emitting display devices and organic light emitting display devices according to a material of a light emitting layer. An active-matrix type organic light emitting display device includes an organic light emitting diode (hereinafter referred to as an "OLED") which emits light by itself, and has advantages in that a response speed is fast and luminous efficiency, luminance, and a viewing angle are large.

In organic light-emitting display devices, organic light-emitting diodes (referred to as "OLEDs") are formed in each of pixels. These organic light display devices not only respond quickly and have excellent light-emitting efficiency, luminance, and viewing angle, but also have excellent contrast ratio and color reproduction rate because they can express black tones as complete black.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like.

In such a display device, when a driving signal such as a scan signal, an EM signal, and a data signal is supplied to a plurality of pixels formed in the display panel, the selected pixel transmits light or emits light directly to thereby display an image.

Each of the sub-pixels includes a driving element that controls a current flowing through a light-emitting element, and a plurality of switch elements that switch the current. In this case, the driving element and the plurality of switch elements may be implemented as an N-channel low temperature polysilicon (LTPS) thin film transistor (TFT) or a P-channel LTPS TFT including low temperature polysilicon. In particular, when all the elements are implemented as P-channel LTPS TFTs, luminance is greatly reduced when a data voltage is changed from a black grayscale to a white grayscale due to the hysteresis characteristics of the TFTs.

SUMMARY

The present disclosure is directed to solving all the above-described necessity and problems.

The present disclosure provides a pixel circuit and a display device including the same.

It should be noted that objects of the present disclosure are not limited to the above-described objects, and other objects of the present disclosure will be apparent to those skilled in the art from the following descriptions.

A pixel circuit according to embodiments of the present disclosure may include a driving element including a first electrode connected to a first node of the pixel circuit, a gate electrode connected to a second node of the pixel circuit, and a second electrode connected to a third node of the pixel circuit; a first switch element connecting the second node to the third node in response to a first gate signal; a second switch element applying a data voltage to the first node in response to a second gate signal; a third switch element connecting a pixel driving voltage line of the pixel circuit to the first node in response to a third gate signal; a fourth switch element connecting the third node to a fourth node of the pixel circuit in response to the third gate signal; a fifth switch element applying a first initialization voltage to the second node in response to a fourth gate signal; a sixth switch element applying a second initialization voltage to the fourth node in response to the second gate signal; a capacitor connected to the pixel driving voltage line and the second node; and a light-emitting element connected to the fourth node and a low potential power voltage line of the pixel circuit.

A pixel circuit according to embodiments of the present disclosure may include a driving element including a first electrode connected to a first node, a gate electrode connected to a second node, and a second electrode connected to a third node; a first switch element connecting the second node to the third node in response to a first gate signal; a second switch element applying a data voltage to the first node in response to the first gate signal; a third switch element connecting a pixel driving voltage line of the pixel circuit to the first node in response to a second gate signal; a fourth switch element connecting the third node to a fourth node in response to a third gate signal; a fifth switch element applying a first initialization voltage to the second node in response to a fourth gate signal; a capacitor connected to the pixel driving voltage line and the second node; and a light-emitting element connected to the fourth node and a low potential power voltage line of the pixel circuit.

A display device according to embodiments of the present disclosure may include a pixel array with a plurality of data lines, a plurality of gate lines, and a plurality of pixel circuits; a data driver outputting a data voltage to the plurality of data lines; and a gate driver outputting gate signals to the plurality of gate lines, wherein each of the plurality of pixel circuits comprises a driving element including a first electrode connected to a first node, a gate electrode connected to a second node, and a second electrode connected to a third node; a first switch element connecting the second node to the third node in response to a first gate signal; a second switch element applying the data voltage to the first node in response to a second gate signal; a third switch element connecting a pixel driving voltage line to the first node in response to a third gate signal; a fourth switch element connecting the third node to a fourth node in response to the third gate signal; a fifth switch element applying a first initialization voltage to the second node in response to a fourth gate signal; a sixth switch element applying a second initialization voltage to the fourth node in response to the second gate signal; a capacitor connected to the pixel driving voltage line and the second node; and a light-emitting element connected to the fourth node and a low potential power voltage line.

A display device according to embodiments of the present disclosure may include a pixel array with a plurality of data lines, a plurality of gate lines, and a plurality of pixel circuits; a data driver outputting a data voltage to the plurality of data lines; and a gate driver outputting gate signals to the plurality of gate lines, wherein each of the pixel circuits comprises a driving element including a first electrode connected to a first node, a gate electrode connected to a second node, and a second electrode connected to a third node; a first switch element connecting the second node to the third node in response to a first gate signal; a second switch element applying the data voltage to the first node in response to the first gate signal; a third switch element connecting a pixel driving voltage line to the first node in response to a second gate signal; a fourth switch element connecting the third node to a fourth node in response to a third gate signal; a fifth switch element applying an initialization voltage to the second node in response to a fourth gate signal; a capacitor connected to the pixel driving voltage line and the second node; and a light-emitting element connected to the fourth node and a low potential power voltage line.

The present disclosure may improve first frame response (FFR) performance by implementing on-bias stress (OBS) driving in an initialization stage using a pixel driving voltage or a data voltage without additional configurations such as a separate voltage source and control thin film transistor (TFT).

The present disclosure may improve the FFR performance so that the response time may be improved as the speed of change from the black grayscale to the white grayscale increases.

In the present disclosure, the flicker may be improved as the stabilization time to the white grayscale is shortened.

In the present disclosure, since a separate voltage source for driving OBS and an additional configuration such as a control TFT are not required, power consumption may be reduced accordingly so that low power driving may be possible.

The effects of embodiments of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing embodiments thereof in detail with reference to the attached drawings, in which.

DETAILED DESCRIPTION

Figure 1:
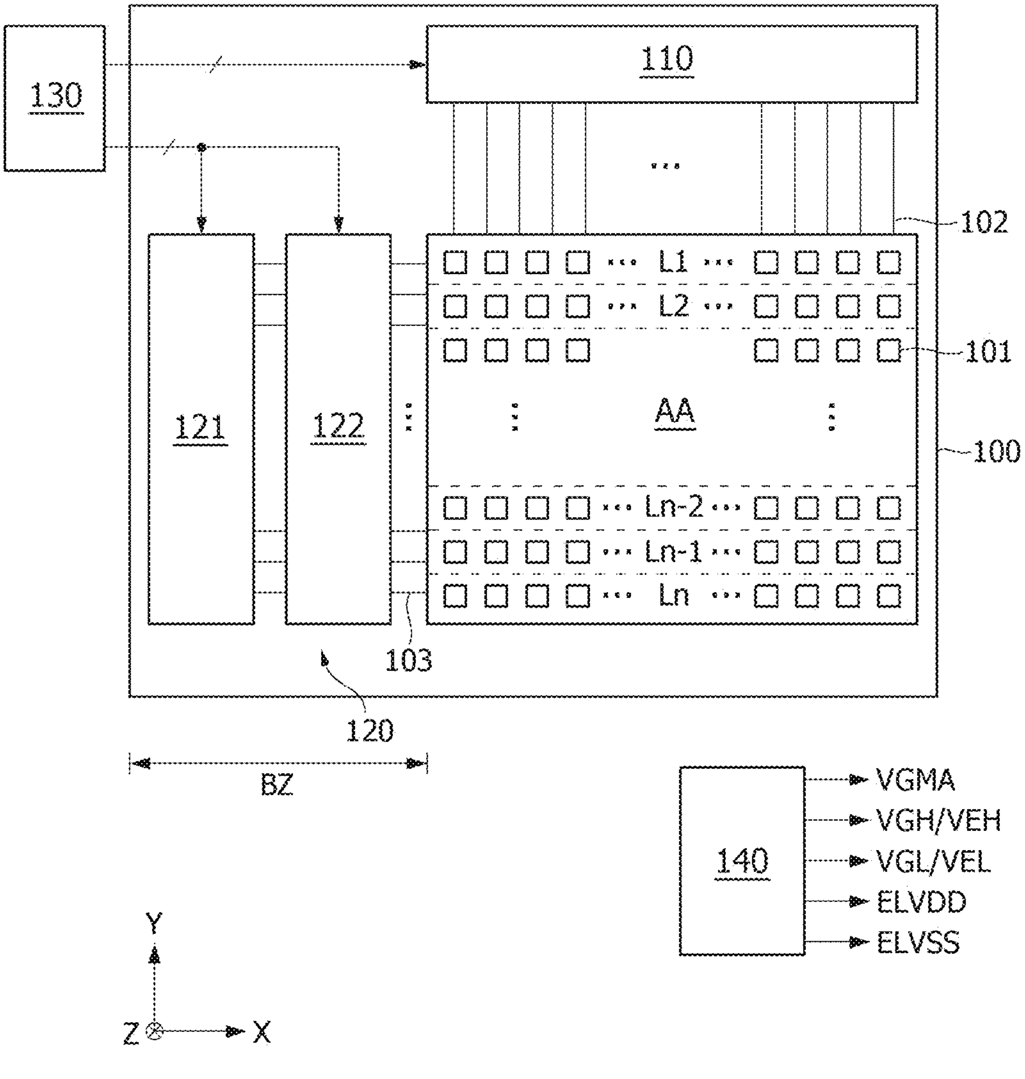
FIG. 1 is a block diagram illustrating a display device according to one or more embodiments of the present disclosure.

Advantages and features of the present disclosure and methods of achieving them will become apparent with reference to preferable embodiments, which are described in detail, in conjunction with the accompanying drawings. However, the present disclosure is not limited to the embodiments to be described below and may be implemented in different forms, the embodiments are only provided to completely disclose the present disclosure and completely convey the scope of the present disclosure to those skilled in the art, and the present disclosure is defined by the disclosed claims.

Advantages and features of the present disclosure and methods of achieving them will become apparent with reference to preferable embodiments, which are described in detail, in conjunction with the accompanying drawings. However, the present disclosure is not limited to the embodiments to be described below and may be implemented in different forms, the embodiments are only provided to completely disclose the present disclosure and completely convey the scope of the present disclosure to those skilled in the art, and the present disclosure is defined by the disclosed claims.

When 'including,' 'having,' 'comprising,' and the like mentioned in the present disclosure are used, other parts may be added unless 'only' is used. A case in which a component is expressed in a singular form includes a plural form unless explicitly stated otherwise.

In interpreting the components, it should be understood that an error range is included even when there is no separate explicit description.

In the case of a description of a positional relationship, for example, when the positional relationship of two parts is described as 'on,' 'at an upper portion,' 'at a lower portion,' 'next to, and the like, one or more other parts may be located between the two parts unless 'immediately' or 'directly' is used.

Although first, second, and the like are used to describe various components, these components are not limited by these terms. These terms are only used to distinguish one component from another. Accordingly, a first component, which is mentioned, below may also be a second component within the technical spirit of the present disclosure.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

In a display device of the present disclosure, the pixel circuit and the gate driving circuit may include a plurality of transistors. Transistors may be implemented as oxide thin film transistors (oxide TFTs) including an oxide semiconductor, low temperature polysilicon (LTPS) TFTs including low temperature polysilicon, or the like.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor.

The transistor is turned on in response to the gate-on voltage and is turned off in response to the gate-off voltage. In the case of the n-channel transistor, a gate-on voltage may be a gate high voltage, and a gate-off voltage may be a gate low voltage. In the case of the p-channel transistor, a gate-on voltage may be a gate low voltage, and a gate-off voltage may be a gate high voltage.

Figure 2:
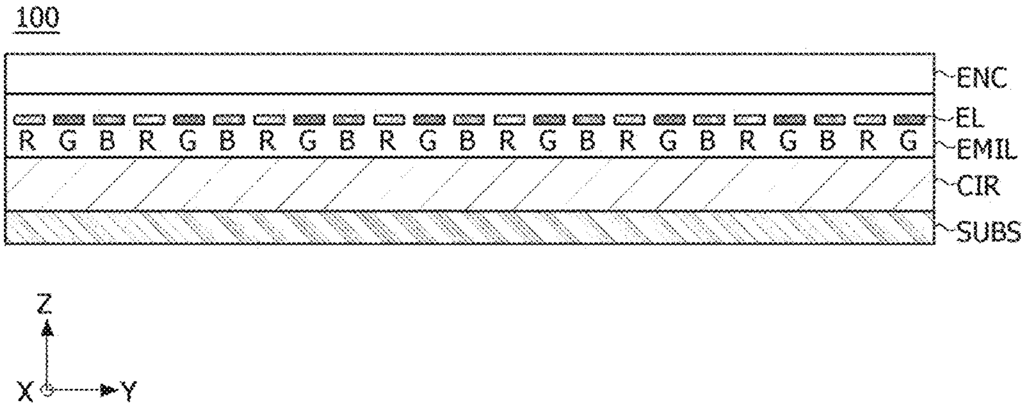
FIG. 2 is a cross-sectional view showing a cross-sectional structure of the display panel shown in FIG. 1 according to one or more embodiments of the present disclosure.

FIG. 1 is a block diagram illustrating a display device according to one or more embodiments of the present disclosure, and FIG. 2 is a cross-sectional view illustrating a cross-sectional structure of the display panel shown in FIG. 1 according to one or more embodiments of the present disclosure.

Referring to FIGS. 1 and 2, a display device according to one or more embodiments of the present disclosure includes a display panel 100, a display panel driving unit configured to write pixel data to pixels of the display panel 100, and a power supply unit 140 configured to generate power required for driving the pixels and the display panel driving unit.

The display panel 100 includes a pixel array AA that displays an input image. The pixel array AA includes a plurality of data lines DL, a plurality of gate lines GL intersected with the data lines DL, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines GL. Sub-pixels arranged in a column direction Y along a data line direction share the same data line DL. One horizontal period 1H is a time obtained by dividing one frame period by the total number of pixel lines L1 to Ln.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

The display panel 100 may be implemented as a flexible display panel. The flexible display panel may be made of a plastic OLED panel. An organic thin film may be disposed on a back plate of the plastic OLED panel, and the pixel array AA may be formed on the organic thin film.

The back plate of the plastic OLED may be a polyethylene terephthalate (PET) substrate. The organic thin film is formed on the back plate. The pixel array AA and a touch sensor array may be formed on the organic thin film. The back plate blocks moisture permeation so that the pixel array AA is not exposed to humidity. The organic thin film may be a thin Polyimide (PI) film substrate. A multi-layered buffer film may be formed of an insulating material (not shown) on the organic thin film. Lines may be formed on the organic thin film so as to supply power or signals applied to the pixel array AA and the touch sensor array.

To implement color, each of the pixels may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels 101 includes a pixel circuit. The pixel circuit is connected to the data line DL and the gate line GL.

The cross-sectional structure of the display panel 100 may include a circuit layer CIR, a light-emitting element layer EMIL, and an encapsulation layer ENC stacked on a substrate SUBS, as shown in FIG. 2.

The circuit layer CIR may include a thin-film transistor (TFT) array including a pixel circuit connected to wirings such as a data line, a gate line, a power line, and the like, and a gate driver 410 and 420. The circuit layer CIR includes a plurality of metal layers insulated with insulating layers interposed therebetween, and a semiconductor material layer. All transistors formed in the circuit layer CIR can be implemented as n-channel oxide TFTs.

The light-emitting element layer EMIL may include a light-emitting element driven by the pixel circuit. The light-emitting element may include a light-emitting element of a red sub-pixel, a light-emitting element of a green sub-pixel, and a light-emitting element of a blue sub-pixel. The light-emitting element layer EMIL may further include a light-emitting element of white sub-pixel. The light-emitting element layer EMIL corresponding to each of the sub-pixels may have a structure in which a light-emitting element and a color filter are stacked. The light-emitting elements EL in the light-emitting element layer EMIL may be covered by multiple protective layers including an organic film and an inorganic film.

The encapsulation layer ENC covers the light-emitting element layer EMIL to seal the circuit layer CIR and the light-emitting element layer EMIL. The encapsulation layer ENC may also have a multi-insulating film structure in which an organic film and an inorganic film are alternately stacked. The inorganic film blocks permeation of moisture and oxygen. The organic film planarizes the surface of the inorganic film. When the organic layer and the inorganic layer are stacked in multiple layers, the movement path of moisture and oxygen becomes longer than that of a single layer, so that penetration of moisture and oxygen affecting the light-emitting element layer EMIL may be effectively blocked.

A touch sensor layer (not shown) may be formed on the encapsulation layer ENC, and a polarizing plate or a color filter layer may be disposed thereon. The touch sensor layer may include capacitive touch sensors that sense a touch input based on a change in capacitance before and after the touch input. The touch sensor layer may have metal wiring patterns and insulating films that form the capacitance of the touch sensors. The insulating films may insulate an area where the metal wiring patterns intersect and may planarize the surface of the touch sensor layer. The polarizing plate may improve visibility and contrast ratio by converting the polarization of external light reflected by metal in the touch sensor layer and the circuit layer. The polarizing plate may be implemented as a circular polarizing plate or a polarizing plate in which a linear polarizing plate and a phase retardation film are bonded together. A cover glass may be adhered to the polarizing plate. The color filter layer may include red, green, and blue color filters. The color filter layer may further include a black matrix pattern. The color filter layer may replace the polarizing plate by absorbing a part of the wavelength of light reflected from the circuit layer and the touch sensor layer, and increase the color purity of an image reproduced in the pixel array.

The power supply unit 140 generates direct current (DC) power necessary to drive the display panel driving unit and the pixel array of the display panel 100 by using a DC-DC converter. The DC-DC converter may include a charge pump, a regulator, a buck converter, a boost converter, and the like. The power supply unit 140 may adjust a level of an input DC voltage applied from a host system (not shown) to generate constant voltages (or DC voltages) such as a gamma reference voltage VGMA, gate-on voltages VGH and VEH, gate-off voltages VGL and VEL, the pixel driving voltage EVDD, the low-potential power voltage EVSS, the initialization voltage VINIT, and the reference voltage VREF. The gamma reference voltage VGMA is supplied to a data driver 110. The gate-on voltages VGH and VEH and the gate-off voltages VGL and VEL are supplied to a gate driver 120. The constant voltages such as the pixel driving voltage EVDD, the low-potential power voltage EVSS, the initialization voltage VINIT, and the reference voltage VREF are commonly supplied to the pixels.

The display panel driving unit writes pixel data of an input image to the pixels of the display panel 100 under control of a timing controller (TCON) 130.

The display panel driving unit includes the data drivers 110 and the gate drivers 120.

A de-multiplexer (DEMUX) may be disposed between the data driver 110 and the data lines DL. The de-multiplexer is omitted from FIG. 1. The de-multiplexer sequentially connects one channel of the data driver 110 to the plurality of data lines DL and distributes in a time division manner the data voltage outputted from one channel of the data driver 110 to the data lines DL, thereby reducing the number of channels of the data driver 110.

The display panel driving circuit may further include a touch sensor driver for driving the touch sensors. The touch sensor driver is omitted from FIG. 1. In a mobile device, the timing controller 130, the power supply unit 140, the data driver 110, and the like may be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer in each of the channels of the data driver 110.

In the data driver 110, the output buffer included in one channel may be connected to adjacent data lines DL through the de-multiplexer array 112 (not shown). The de-multiplexer array 112 may be formed directly on the substrate of the display panel 100 or integrated into one drive IC together with the data driver 110.

The gate driver 120 may be implemented as a gate in panel (GIP) circuit formed directly on a bezel BZ area of the display panel 100 together with the TFT array of the pixel array AA. The gate driver 120 sequentially outputs gate signals to the gate lines GL under the control of the timing controller 130. The gate driver 120 may sequentially supply the gate signals to the gate lines GL by shifting the gate signals using a shift register.

The timing controller 130 receives, from a host system (not shown), digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (Phase-Alternating Line) scheme.

Based on the timing signals Vsync, Hsync, and DE received from the host system, the timing controller 130 generates a data timing control signal for controlling the operation timing of the data driver 110, MUX signals for controlling the operation timing of the de-multiplexer array 112, and a gate timing control signal for controlling the operation timing of the gate driver 120.

The voltage level of the gate timing control signal outputted from the timing controller 130 may be converted into the gate-on voltages VGH and VEH and the gate-off voltages VGL and VEL through a level shifter (not shown) and then supplied to the gate driver 120. That is, the level shifter converts a low-level voltage of the gate timing control signal into the gate-off voltages VGL and VEL and converts a high-level voltage of the gate timing control signal into the gate-on voltages VGH and VEH. The gate timing signal includes the start pulse and the shift clock.

The host system may include a main board of one of a television system, a set-top box, a navigation system, a personal computer (PC), a home theater system, a vehicle system, and a mobile device system. In this case, the data driver 110, the gate driver 120, the timing controller 130, and the like may be integrated into one drive IC (DIC) in mobile devices or wearable devices.

Figure 3:
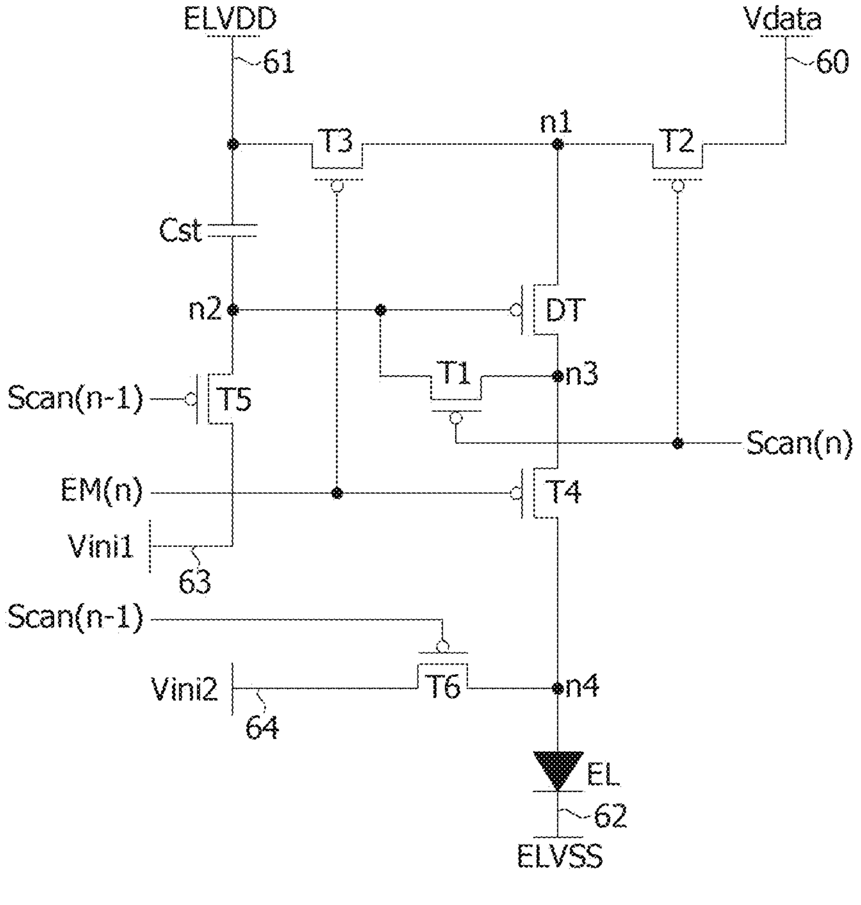
FIG. 3 is a diagram illustrating a pixel circuit according to one or more embodiments of the present disclosure.
Figure 4:
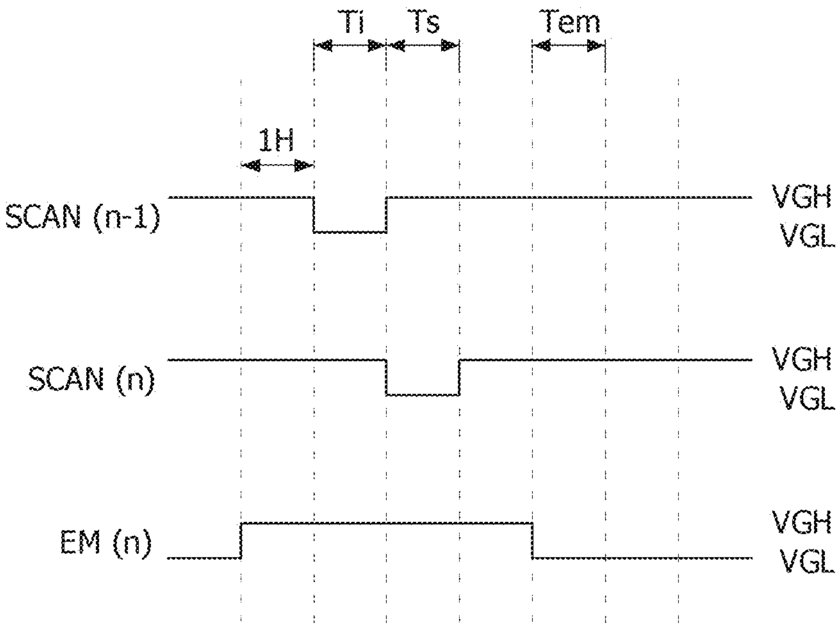
FIG. 4 is a diagram illustrating a driving timing of the pixel circuit shown in FIG. 3 according to one or more embodiments of the present disclosure.
Figure 5:
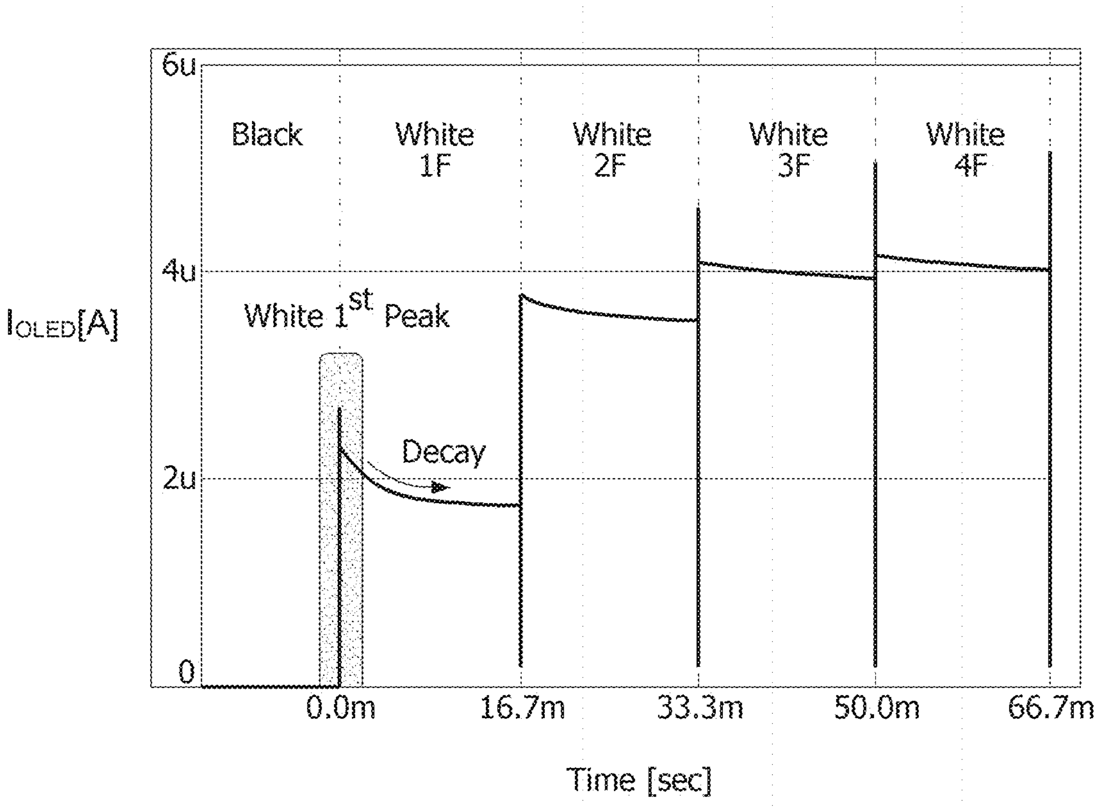
FIG. 5 is a diagram for explaining a problem that occurs when the pixel circuit of FIG. 4 is driven according to one or more embodiments of the present disclosure.

FIG. 3 is a diagram illustrating a pixel circuit according to one or more embodiments of the present disclosure, FIG. 4 is a diagram illustrating a driving timing of the pixel circuit shown in FIG. 3 according to one or more embodiments of the present disclosure, and FIG. 5 is a diagram for explaining a problem that occurs when the pixel circuit of FIG. 4 is driven according to one or more embodiments of the present disclosure.

Referring to FIGS. 3 to 4, the pixel circuit according to the comparative example includes a light-emitting element EL, a driving element DT, a plurality of switch elements T1, T2, T3, T4, T5, and T6, and a capacitor Cst. The driving element DT and the switch elements T1, T2, T3, T4, T5, and T6 may be implemented as P-channel LTPS TFTs.

The pixel circuit is driven in the order of an initialization step Ti, a sampling step Ts, and a light emission step Tem.

TFTs of the pixel circuit in which all elements are implemented as P-channel LTPS TFTs have hysteresis characteristics. Due to the hysteresis characteristic, when the data voltage changes from the black grayscale to the white grayscale, the value of the threshold voltage Vth decreases, resulting in a significant decrease in luminance compared to when the data voltage changes from the white grayscale to the white grayscale with no change in the threshold voltage, resulting in a degradation of FFR performance.

As shown in FIG. 5, when the data voltage changes from the black grayscale to the white grayscale and from the first frame to the second frame of the white grayscale, the change amount of the threshold voltage at the end of the sampling step Ts and the change amount of the threshold voltage at the start of the light emission step Tem are different, resulting in the occurrence of a peak in the first frame of the white grayscale.

In order to improve the FFR performance, the luminance difference between the first frame and the fourth frame of the white grayscale needs to be improved. To this end, the driving element DT must be initialized before the sampling step to a constant voltage in order to suppress the occurrence of hysteresis due to the difference between the previous frame data voltage and the current frame data voltage. That is, on-bias stress (OBS) driving configured to apply stress to the driving element DT to a constant Vgs voltage is required in the initialization step. However, in the pixel circuit of the comparative example, the source node of the driving element is floated in the initialization step, so that the voltage of the source node varies according to the condition of the previous data voltage. Since there is no separate voltage, control TFT, and timing control for driving the OBS to apply a constant voltage to the source or drain of the driving element in the pixel circuit of the comparative example, it is difficult to improve the first frame response (FFR) performance without an additional configuration for applying the OBS voltage to the pixel circuit.

Therefore, in an embodiment, it is intended to improve the FFR performance by implementing OBS driving in the initialization step using a pixel driving voltage or a data voltage without a separate additional configuration.

Hereinafter, in the first embodiment of the present disclosure, OBS driving using a data voltage will be described.

Figure 6:
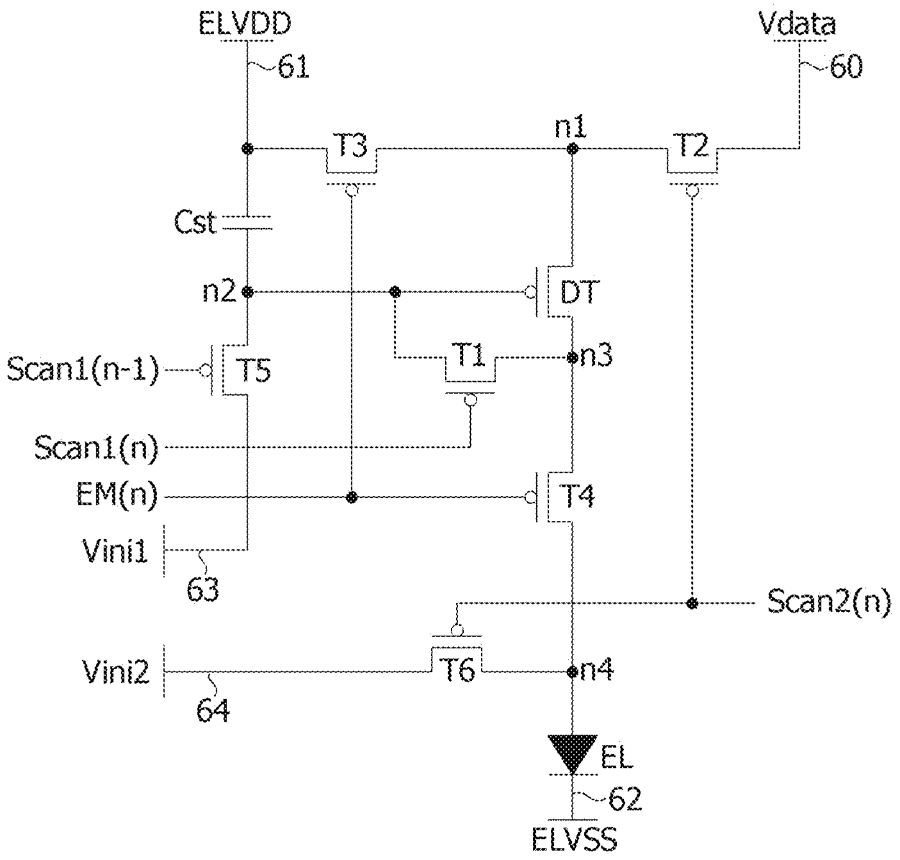
FIG. 6 is a diagram illustrating the pixel circuit according to a first embodiment of the present disclosure.
Figure 7:
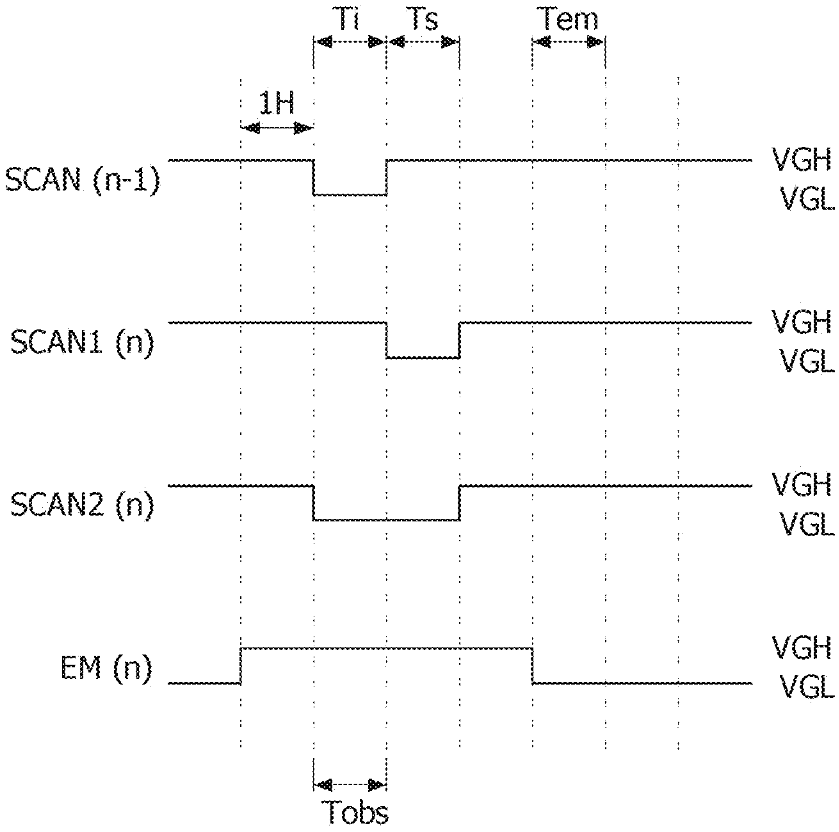
FIG. 7 is a diagram illustrating a driving timing of the pixel circuit shown in FIG. 6 according to the first embodiment of the present disclosure.
Figure 8A:
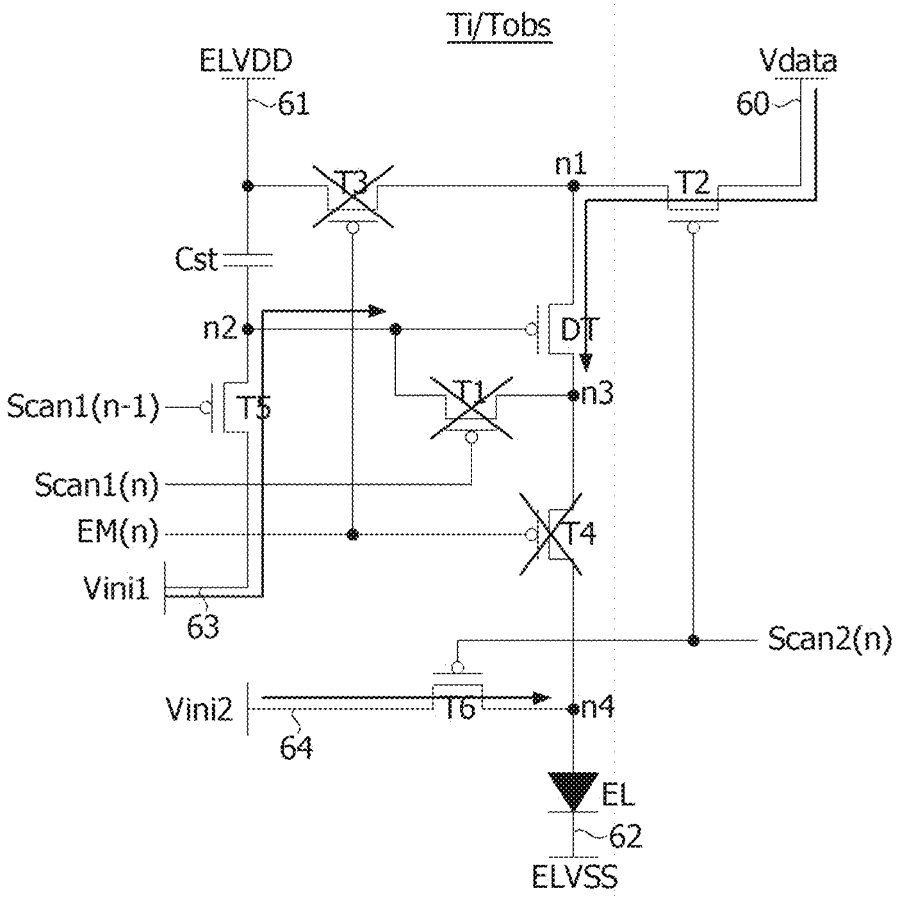
FIGS. 8A to 8C are diagrams for explaining an operation principle of the pixel circuit of FIG. 7 according to the first embodiment of the present disclosure.
Figure 8B:
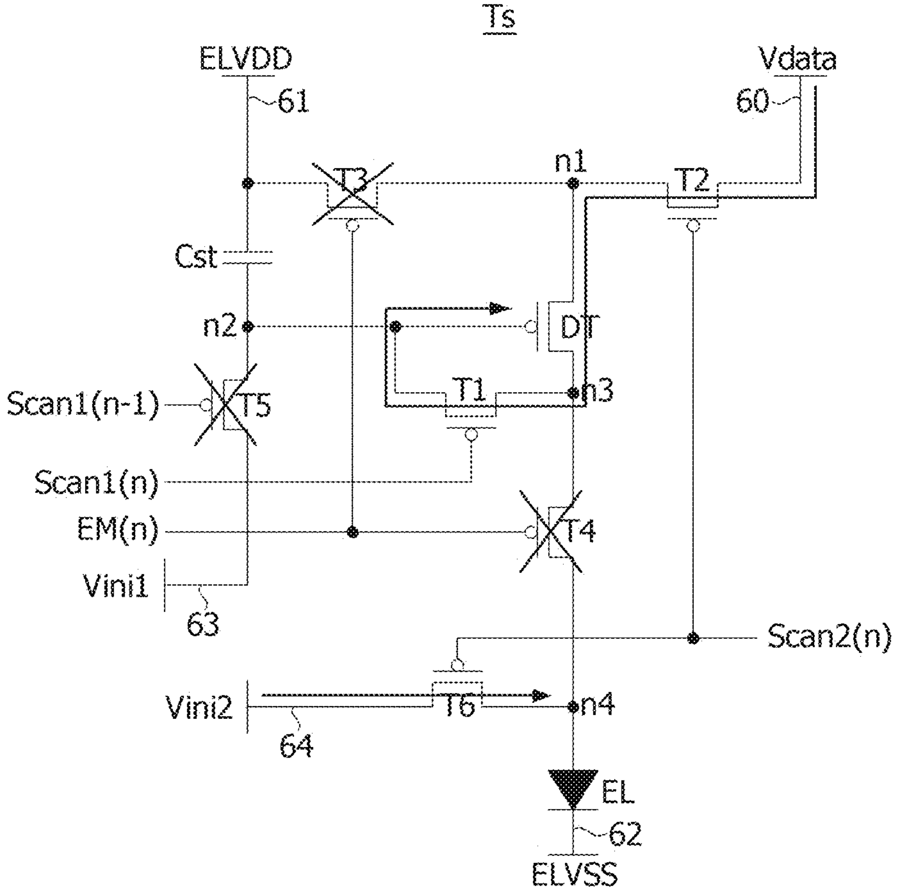
Figure 8C:
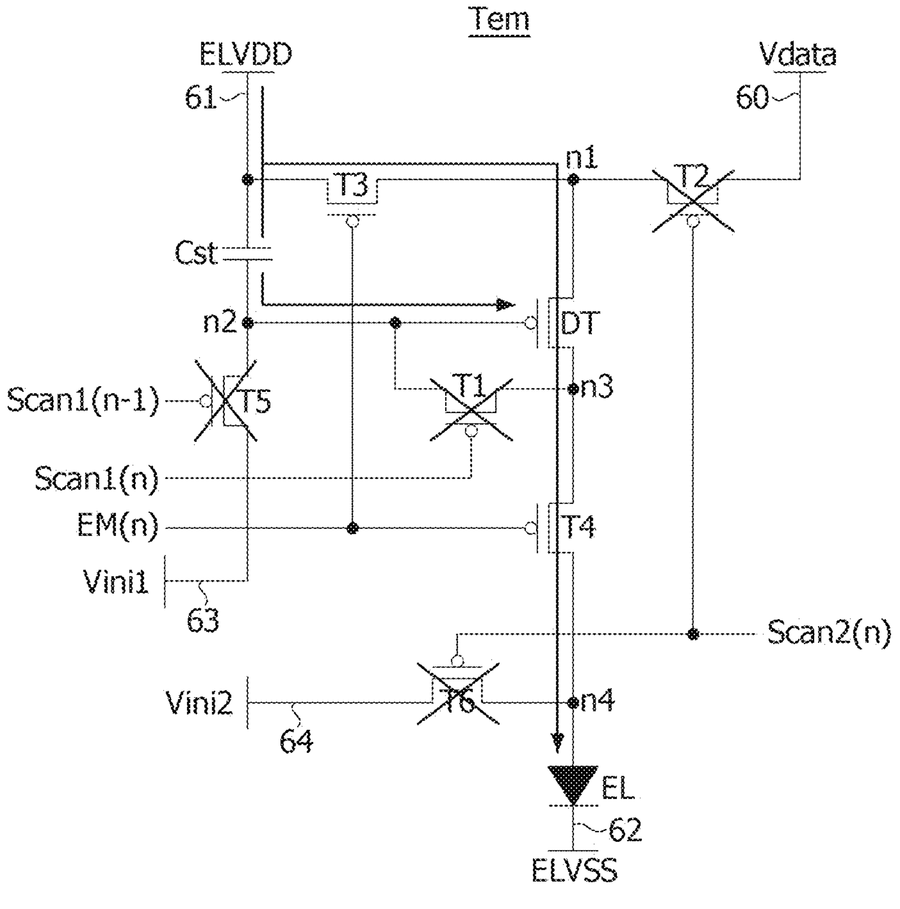
Figure 9:
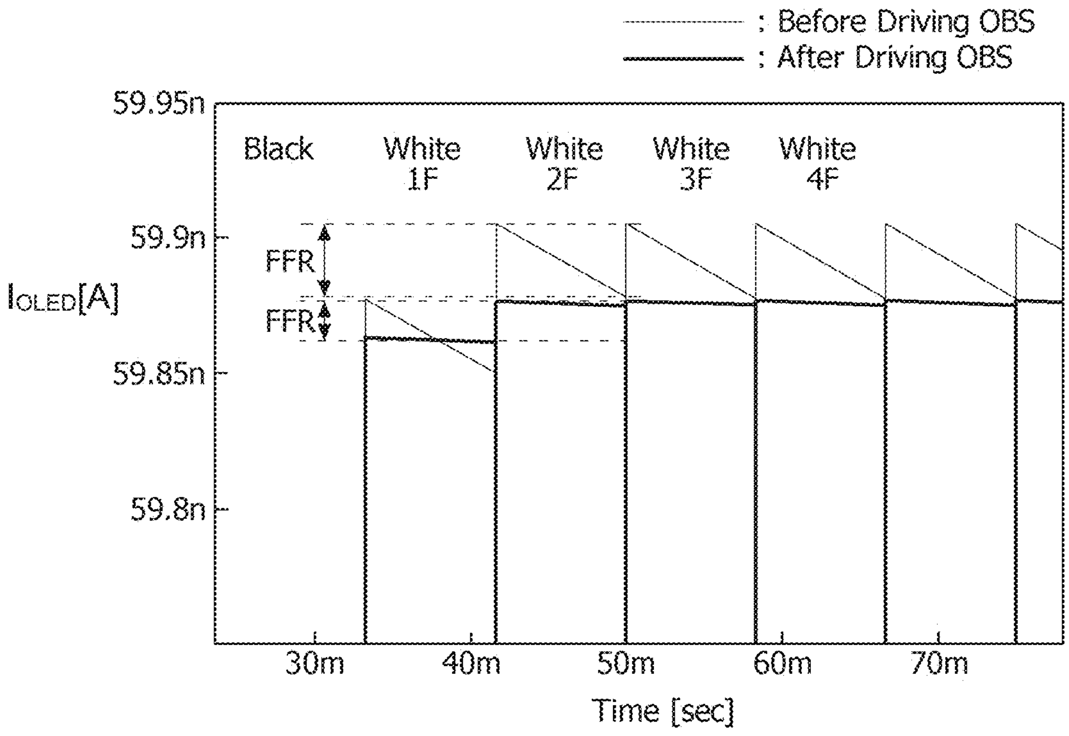
FIG. 9 is a diagram for comparing and explaining simulation results of the pixel circuit according to the first embodiment of the present disclosure.

FIG. 6 is a diagram illustrating the pixel circuit according to a first embodiment of the present disclosure, FIG. 7 is a diagram illustrating a driving timing of the pixel circuit shown in FIG. 6 according to the first embodiment of the present disclosure, FIGS. 8A to 8C are diagrams for explaining an operation principle of the pixel circuit of FIG. 7 according to the first embodiment of the present disclosure, and FIG. 9 is a diagram for comparing and explaining simulation results of the pixel circuit according to the first embodiment of the present disclosure.

Referring to FIG. 6, a pixel circuit according to the first embodiment of the present disclosure includes a light-emitting element EL, a driving element DT supplying a current to the light-emitting element EL, a plurality of switch elements T1, T2, T3, T4, T5, and T6 for switching a current path connected to the driving element DT, and a capacitor Cst for storing a gate-source voltage of the driving element DT. The driving element DT and the switch elements T1, T2, T3, T4, T5, and T6 may be implemented as P-channel LTPS TFTs.

The capacitor Cst is connected between the pixel driving voltage line 61 and the second node n2. The first electrode of the capacitor Cst is connected to the pixel driving voltage line 61, and the second electrode is connected to the second node n2. The pixel driving voltage ELVDD is supplied to the pixel circuit through the pixel driving voltage line 61. The first node n1 is connected to a first electrode of a driving element DT, a second electrode of a third switch element T3, and a first electrode of a second switch element T2. The second node n2 is connected to a second electrode of a capacitor Cst, a gate electrode of a driving element DT, a first electrode of a first switch element T1, and a first electrode of a fifth switch element T5.

The first switch element T1 is turned on according to the gate-on voltage VGL of a second scan signal SCAN1(*n*) to connect the gate electrode and the second electrode of the driving element DT. The first switch element T1 includes a gate electrode to which the second scan signal SCAN1(*n*) is applied, a first electrode connected to the second node n2, and a second electrode connected to the third node n3. The third node n3 is connected to the second electrode of the driving element DT, the second electrode of the first switch element T1, and the first electrode of the fourth switch element T4.

The second switch element T2 is turned on according to the gate-on voltage VGL of a third scan signal SCAN2(*n*) to apply the data voltage Vdata to the first electrode of the driving element DT. The second switch element T2 includes a gate electrode to which the third scan signal SCAN2(*n*) is applied, a first electrode connected to the first node n1, and a second electrode connected to the data line 60. The first node n1 is connected to the first electrode of the driving element DT, the first electrode of the second switch element T2, and the second electrode of the third switch element T3.

The third switch element T3 supplies the pixel driving voltage ELVDD to the first electrode of the driving element DT in response to the EM signal EM(n). The third switch element T3 includes a gate electrode to which the EM signal EM(n) is applied, a first electrode connected to the pixel driving voltage line 61, and a second electrode connected to the first node n1.

The fourth switch element T4 is turned on according to the gate-on voltage VGL of the EM signal EM(n) to connect the second electrode of the driving element DT to the anode of the light-emitting element EL. The fourth switch element T4 includes a gate electrode to which the EM signal EM(n) is applied, a first electrode connected to the third node n3, and a second electrode connected to the fourth node n4. The fourth node n4 is connected to the anode electrode of the light-emitting element EL, the second electrode of the fourth switch element T4, and the second electrode of the sixth switch element T6.

The fifth switch element T5 is turned on according to the gate-on voltage VGL of a first scan signal SCAN1(*n*−1)], and connects the second node n2 to the first initialization voltage line 63 to initialize the gates of the capacitor Cst and the driving element DT during the initialization step Ti. The fifth switch element T5 includes a gate electrode to which the first scan signal SCAN1(*n*−1) is applied, a first electrode connected to the second node n2, and a second electrode connected to the first initialization voltage line 63.

The sixth switch element T6 is turned on according to the gate-on voltage VGL of the third scan signal SCAN2(*n*) so as to connect the second initialization voltage line 64 to the anode of the light-emitting element EL during the initialization step Ti. During the initialization step Ti, the anode voltage of the light-emitting element EL is discharged to the second initialization voltage Vini2 through the sixth switch element T6. In this case, the light-emitting element EL does not emit light because the voltage between the anode and the cathode is lower than its threshold voltage. The sixth switch element T6 includes a gate electrode to which the third scan signal SCAN2(*n*) is applied, a first electrode to which the second initialization voltage line 64 is connected, and a second electrode to which the fourth node n4 is connected.

The driving element DT drives the light-emitting element EL by adjusting a current flowing through the light-emitting element EL according to the gate-source voltage Vgs. The driving element DT includes a gate electrode connected to the second node n2, a first electrode connected to the first node n1, and a second electrode connected to the third node n3.

The light-emitting element EL is connected between the fourth node n4 and the low potential power voltage line 62. The light-emitting element EL may be implemented as an OLED. The OLED includes an organic compound layer formed between the anode and the cathode. The organic compound layer may include a hole injection layer (HIL), a hole transport layer (HTL), an emission layer (EML), an electron transport layer (ETL), and an electron injection layer (EIL), but is not limited thereto. When a voltage is applied to the anode and the cathode of the OLED, holes passing through the hole transport layer (HTL) and electrons passing through the electron transport layer (ETL) are moved to the emission layer (EML) to form excitons, and as a result, visible light is emitted from the emission layer (EML).

The pixel circuit according to the first embodiment is driven in the order of an OBS step Tobs, an initialization step Ti, a sampling step Ts, and a light emission step Tem as illustrated in FIG. 7.

In the initialization step Ti of FIG. 8A, the first switch element T1, the third switch element T3, and the fourth switch element T4 are turned off, and the fifth switch element T5 is turned on by the first scan signal SCAN1(*n*−1), so that the voltage of the second node n2 is discharged to the first initialization voltage Vini1, and the sixth switch element T6 is turned on by the third scan signal SCAN2(*n*), so that a voltage of the fourth node n4 is discharged to the second initialization voltage Vini2. Here, the first initialization voltage Vini1 and the second initialization voltage Vini2 are set to as follows: Vini1≤Vini2.

At the same time, in the OBS step Tobs, the second switching element T2 is turned on by the third scan signal SCAN2(*n*) to supply the data voltage Vdata(n−1) applied to the previous pixel line to the first electrode of the driving element DT. For example, the data voltage Vdata(n−1) may be between 0 and 255 grayscale and may have a value between 2V and 5V.

In this case, the initialization step Ti is performed at the same timing as the OBS step Tobs. Accordingly, the voltage of the second node n2 becomes Vg=Vini1, the voltage of the first node n1 becomes Vdata(n−1), and thus the source-gate voltage of the driving element becomes Vsg=Vini1−Vdata (n−1).

In the sampling step Ts of FIG. 8B, the third switch element T3, the fourth switch element T4, and the fifth switch element T5 are turned off, the first switch element T1 is turned on by the second scan signal SCAN1(*n*), and the second switch element T2 is turned on by the third scan signal SCAN2(*n*), so that a data voltage is applied to the first node n1 and the second node n2.

In this case, the sixth switch element T6 is turned on together with the second switch element T2 by the third scan signal SCAN2(*n*) so that the second initialization voltage Vini2 is applied to the fourth node n4.

Therefore, the voltage of the second node n2 becomes Vg=Vdata−|Vth|, and the voltage of the first node n1 becomes Vs=Vdata, so that the source-gate voltage of the driving element becomes Vsg=|Vth|.

In the light emission step Tem of FIG. 8C, the first switch element T1, the second switch element T2, the fifth switch element T5, and the sixth switch element T6 are turned off, and the third switch element T3 and the fourth switch element T4 are turned on by the EM signal EM(n), so that a current flows through the light-emitting element EL through the driving element DT to emit light. The voltage of the second node n2 becomes Vg=Vdata−|Vth|, and the voltage of the first node n1 becomes Vs=ELVDD, so that a source-gate voltage of the driving element becomes Vsg-ELVDD−Vdata+|Vth|.

Referring to FIG. 9, the pixel circuit according to the first embodiment performs an OBS step using a data voltage together in an initialization step, thereby improving a first frame response (FFR) performance. That is, the pixel circuit according to the first embodiment is greatly improved when a data voltage is changed from the black grayscale to the white grayscale compared to the pixel circuit according to the comparative example of FIG. 3.

As described above, in the first embodiment of the present disclosure, FFR improvement may be possible by realizing OBS driving using the data voltage Vdata without a separate voltage, control TFT, and timing control.

Hereinafter, in the second embodiment of the present disclosure, OBS driving using a pixel driving voltage will be described.

Figure 10:
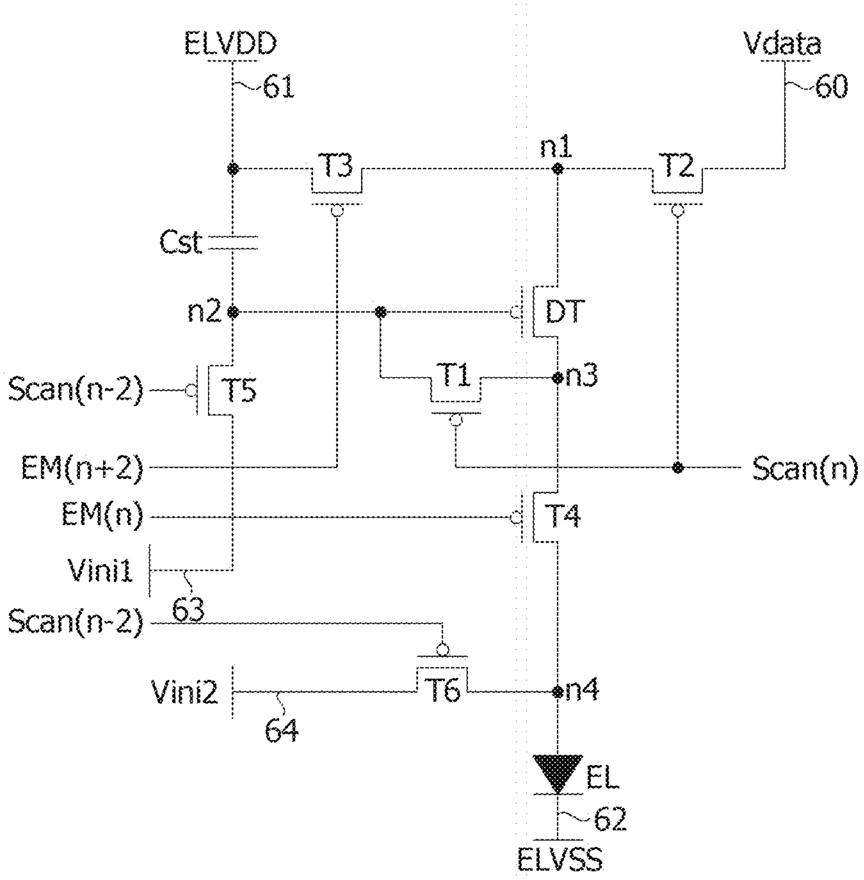
FIG. 10 is a diagram illustrating the pixel circuit according to a second embodiment of the present disclosure.
Figure 11:
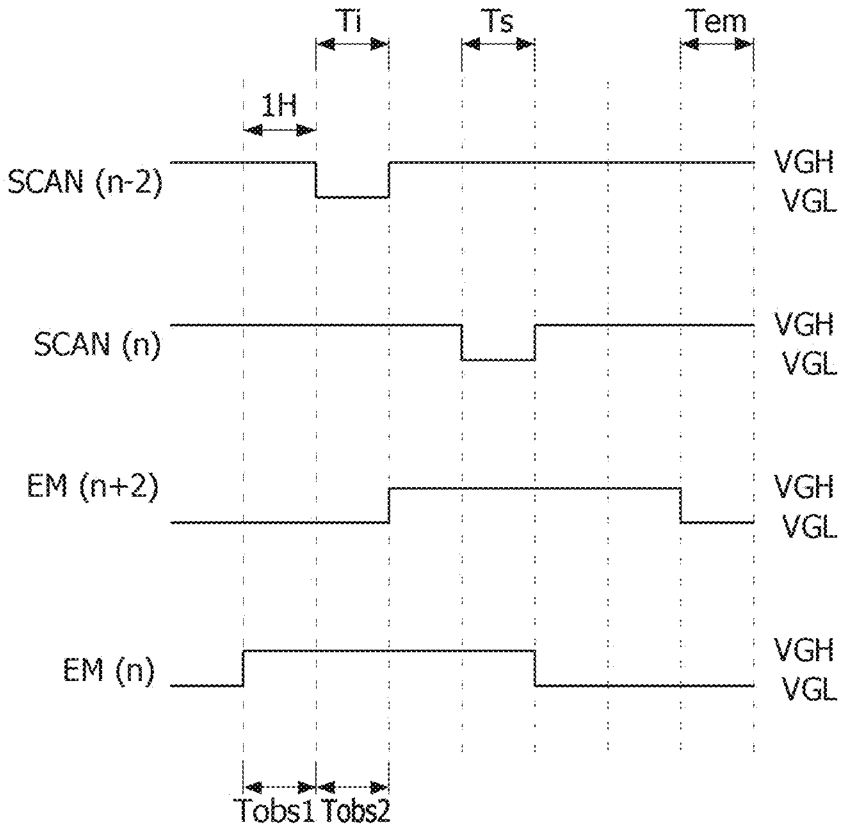
FIG. 11 is a diagram illustrating a driving timing of the pixel circuit shown in FIG. 10 according to the second embodiment of the present disclosure.
Figure 12A:
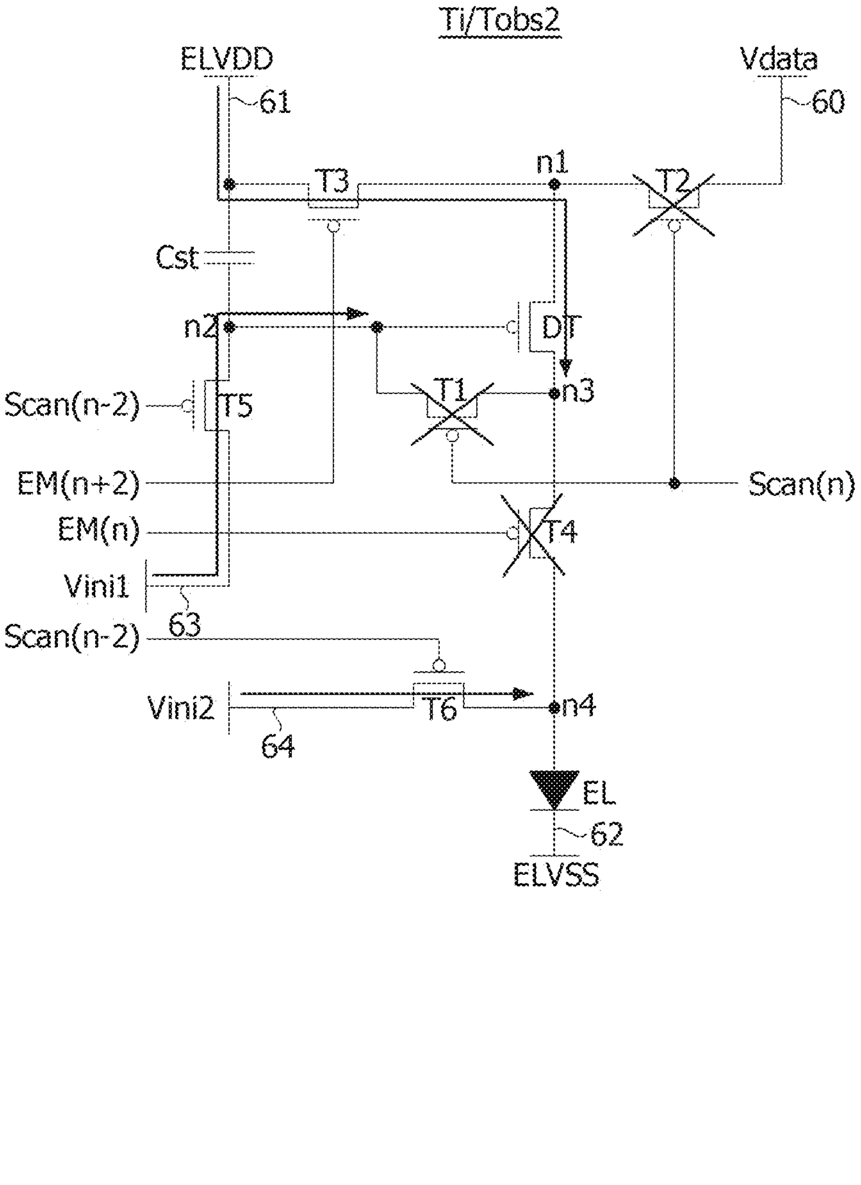
FIGS. 12A to 12C are diagrams for explaining an operation principle of the pixel circuit of FIG. 11 according to the second embodiment of the present disclosure.
Figure 12B:
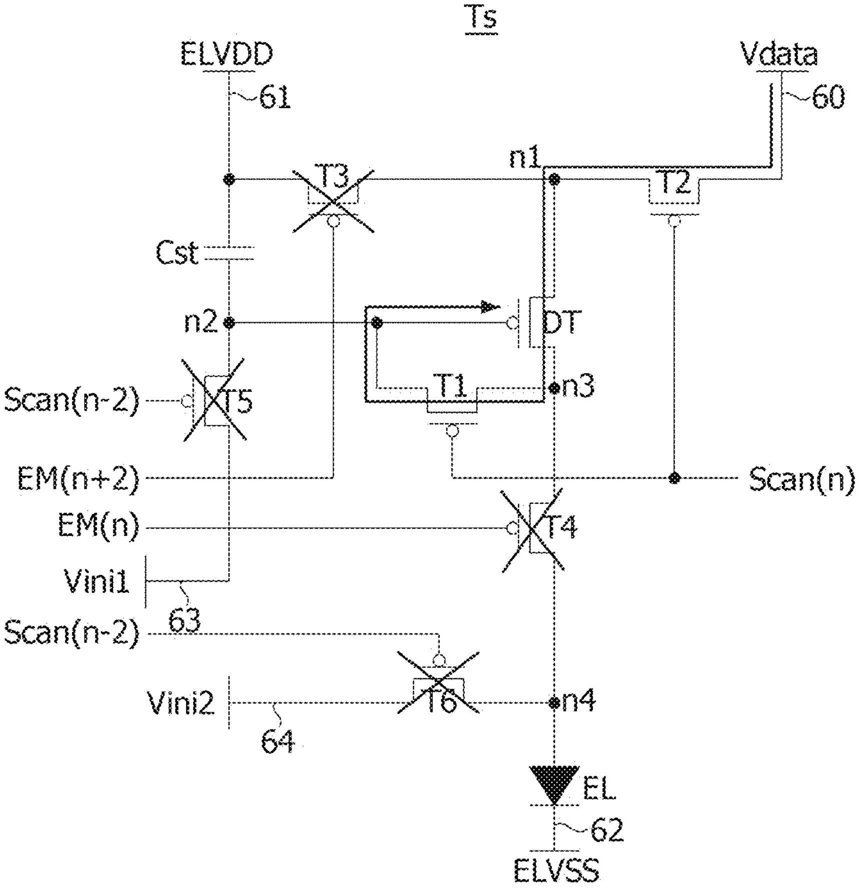
Figure 12C:
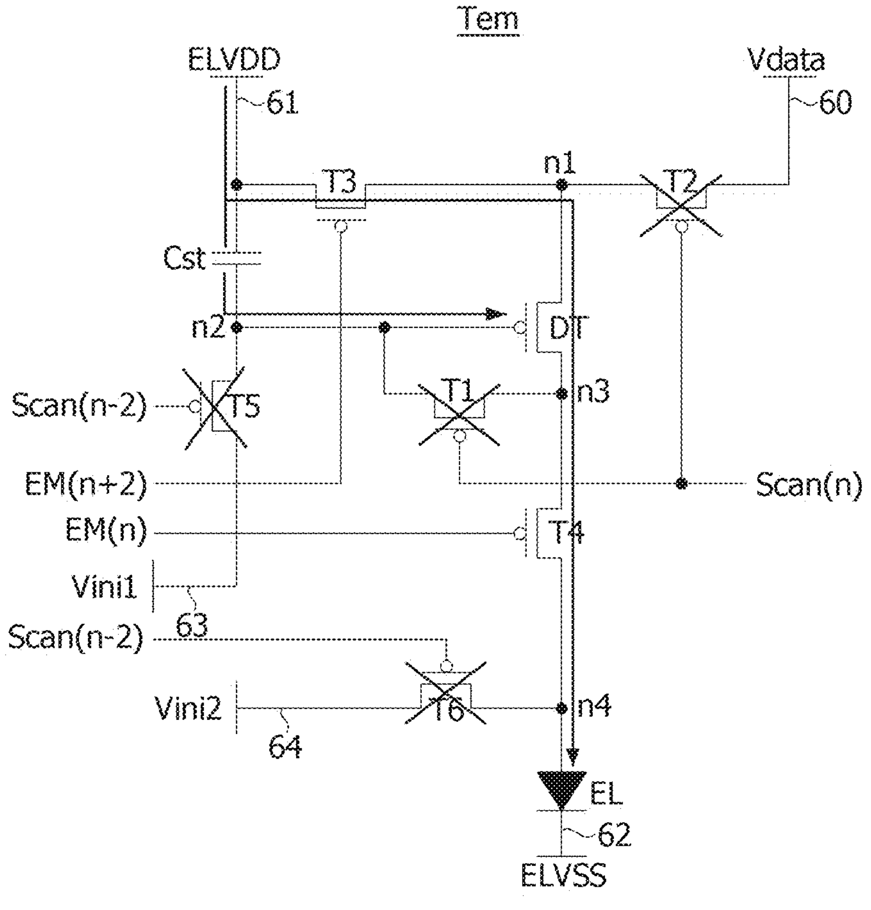
Figure 13:
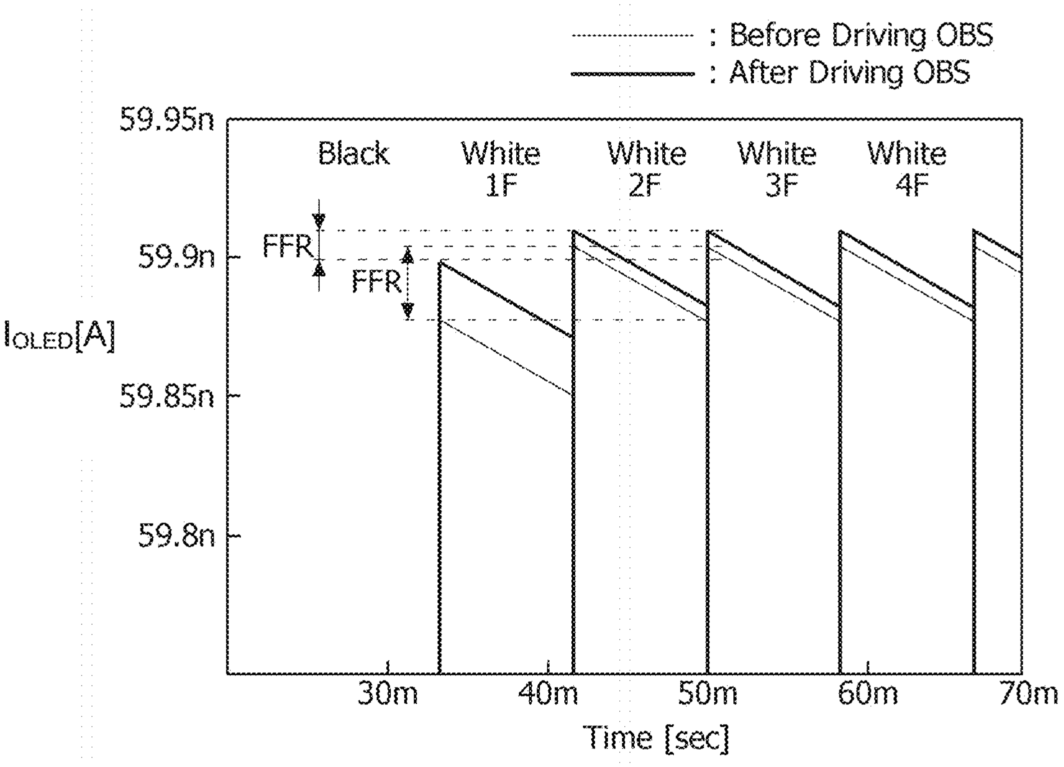
FIG. 13 is a diagram for comparing and explaining simulation results of a pixel circuit according to the second embodiment of the present disclosure.

FIG. 10 is a diagram illustrating the pixel circuit according to a second embodiment of the present disclosure, FIG. 11 is a diagram illustrating a driving timing of the pixel circuit shown in FIG. 10 according to the second embodiment of the present disclosure, FIGS. 12A to 12C are diagrams for explaining an operation principle of the pixel circuit of FIG. 11 according to the second embodiment of the present disclosure, and FIG. 13 is a diagram for comparing and explaining simulation results of a pixel circuit according to the second embodiment of the present disclosure.

Referring to FIG. 10, the pixel circuit according to the second embodiment of the present disclosure includes a light-emitting element EL, a driving element DT supplying a current to the light-emitting element EL, a plurality of switch elements T1, T2, T3, T4, T5, and T6 configured to switch a current path connected to the driving element DT, and a capacitor Cst configured to store a gate-source voltage of the driving element DT. The driving element DT and the switch elements T1, T2, T3, T4, T5, and T6 may be implemented as P-channel LTPS TFTs.

The capacitor Cst is connected between the pixel driving voltage line 61 and the second node n2. The first electrode of the capacitor Cst is connected to the pixel driving voltage line 61, and the second electrode is connected to the second node n2. The second node n2 is connected to the second electrode of the capacitor Cst, the gate electrode of the driving element DT, the first electrode of the first switch element T1, and the first electrode of the fifth switch element T5.

The first switch element T1 is turned on according to the gate-on voltage VGL of the second scan signal SCAN(n) to connect the gate electrode and the second electrode of the driving element DT. The first switch element T1 includes a gate electrode to which the second scan signal SCAN(n) is applied, a first electrode connected to the second node n2, and a second electrode connected to the third node n3. The third node n3 is connected to the second electrode of the driving element DT, the second electrode of the first switch element T1, and the first electrode of the fourth switch element T4.

The second switch element T2 is turned on according to the gate-on voltage VGL of the second scan signal SCAN(n) to apply the data voltage Vdata to the first electrode of the driving element DT. The second switch element T2 includes a gate electrode to which the second scan signal SCAN(n) is applied, a first electrode connected to the first node n1, and a second electrode connected to the data line 60. The first node n1 is connected to the first electrode of the driving element DT, the first electrode of the second switch element T2, and the second electrode of the third switch element T3.

The third switch element T3 supplies the pixel driving voltage ELVDD to the first node n1 in response to the first EM signal EM(n+2). The third switch element T3 includes a gate electrode to which the first EM signal EM(n+2) is applied, a first electrode connected to the pixel driving voltage line 61, and a second electrode connected to the first node n1.

The fourth switch element T4 is turned on according to the gate-on voltage VGL of the second EM signal EM(n) to connect the second electrode of the driving element DT to the anode of the light-emitting element EL. The fourth switch element T4 includes a gate electrode to which the second EM signal EM(n) is applied, a first electrode connected to the third node n3, and a second electrode connected to the fourth node n4. The fourth node n4 is connected to the anode electrode of the light-emitting element EL, the second electrode of the fourth switch element T4, and the second electrode of the sixth switch element T6.

The fifth switch element T5 is turned on according to the gate-on voltage VGL of the first scan signal SCAN(n−2) so as to connect the second node n2 to the first initialization voltage line 63, thereby initializing the gates of the capacitor Cst and the driving element DT during the initialization step Ti. The fifth switch element T5 includes a gate electrode to which the first scan signal SCAN(n−2) is applied, a first electrode to which the second node n2 is connected, and a second electrode to which the first initialization voltage line 63 is connected.

The sixth switch element T6 is turned on according to the gate-on voltage VGL of the first scan signal SCAN(n−2) so as to connect the second initialization voltage line 64 to the anode of the light-emitting element EL during the initialization step Ti. During the initialization step Ti, the anode voltage of the light-emitting element EL is discharged to the second initialization voltage Vini2 through the sixth switch element T6. In this case, the light-emitting element EL does not emit light because the voltage between the anode and the cathode is lower than its threshold voltage. The sixth switch element T6 includes a gate electrode to which the first scan signal SCAN(n−2) is applied, a first electrode connected to the second initialization voltage line 64, and a second electrode connected to the fourth node n4.

The driving element DT drives the light-emitting element EL by adjusting a current flowing through the light-emitting element EL according to the gate-source voltage Vgs. The driving element DT includes a gate electrode connected to the second node n2, a first electrode connected to the first node n1, and a second electrode connected to the third node n3.

The light-emitting element EL is connected between the fourth node n4 and the low potential power voltage line 62. The light-emitting element EL may be implemented as an OLED. The OLED includes an organic compound layer formed between the anode and the cathode. The organic compound layer may include a hole injection layer (HIL), a hole transport layer (HTL), an emission layer (EML), an electron transport layer (ETL), and an electron injection layer (EIL), but is not limited thereto. When a voltage is applied to the anode and the cathode of the OLED, holes passing through the hole transport layer (HTL) and electrons passing through the electron transport layer (ETL) are moved to the emission layer (EML) to form excitons, and as a result, visible light is emitted from the emission layer (EML).

The pixel circuit according to the second embodiment is driven in the order of a first OBS step Tobs1, a second OBS step Tobs2, an initialization step Ti, a sampling step Ts, and a light emission step Tem as illustrated in FIG. 11.

In the first OBS step Tobs1 before the initialization step Ti, the third switching element T3 is turned on by the first EM signal [EM(n+2)] of the (n+2)th pixel line to supply the pixel driving voltage ELVDD to the first electrode of the driving element DT.

In the initialization step Ti of FIG. 12A, the first switch element T1, the second switch element T2, and the fourth switch element T4 are turned off, and the fifth switch element T5 is turned on, so that the voltage of the second node n2 is discharged to the first initialization voltage Vini1, and the sixth switch element T6 is turned on, so that the voltage of the fourth node n4 is discharged to the second initialization voltage Vini2.

At the same time, in the second OBS step Tobs2, the third switching element T3 is turned on by the first EM signal EM(n+2) to supply the pixel driving voltage ELVDD to the first electrode of the driving element DT. In this case, the fourth switching element T4 is turned off by the second EM signal EM(n) so that the light-emitting element EL is not emitted by the turn-on of the driving element DT.

In this case, the initialization step Ti is performed at the same timing as the second OBS step Tobs2. Therefore, the voltage of the second node n2 becomes Vg=Vini1, the voltage of the first node n1 becomes Vs=ELVDD, and the source-gate voltage of the driving element becomes Vsg=ELVDD−Vini1.

In the sampling step Ts of FIG. 12B, the third switch element T3, the fourth switch element T4, the fifth switch element T5, and the sixth switch element T6 are turned off, and the first switch element T1 and the second switch element T2 are turned on by the second scan signal SCAN(n) so that a data voltage is applied to the first node n1. As a result, the voltage of the second node n2 becomes Vg=Vdata−|Vth|, and the voltage of the first node n1 becomes Vs=Vdata, and the source-gate voltage of the driving element becomes Vsg=|Vth|.

In the light emission step Tem of FIG. 12C, the first switch element T1, the second switch element T2, the fifth switch element T5, and the sixth switch element T6 are turned off, and the fourth switch element T4 is turned on by the second EM signal EM(n) so that a current flows through the light-emitting element EL through the driving element DT to emit light. Accordingly, the voltage of the second node n2 becomes Vg=Vdata−|Vth|, and the voltage of the first node n1 becomes Vs=ELVDD, and the voltage between source and gate of the driving element becomes Vsg=ELVDD−Vdata+|Vth|.

Referring to FIG. 13, a pixel circuit according to the second embodiment of the present disclosure performs an OBS step using a pixel driving voltage together in an initialization step, thereby improving a first frame response (FFR) performance. That is, a pixel circuit according to the second embodiment is greatly improved when a data voltage is changed from the black grayscale to the white grayscale compared to a pixel circuit according to a comparative example of FIG. 3.

As such, in the second embodiment of the present disclosure, FFR improvement may be possible by realizing OBS driving using the pixel driving voltage ELVDD without separate voltage, control TFT, and timing control.

In addition, when OBS driving using pixel driving voltage (ELVDD) is applied to the pixel circuit of the comparative example, FFR improvement is possible, but when black data is applied, black floating occurs in which complete black cannot be displayed. However, in the pixel circuit of the embodiment, since the third switch element T3 and the fourth switch element T4 are driven separately, that is, not by one EM signal, but by different EM signals, improvement of black floating may be possible.

Figure 14:
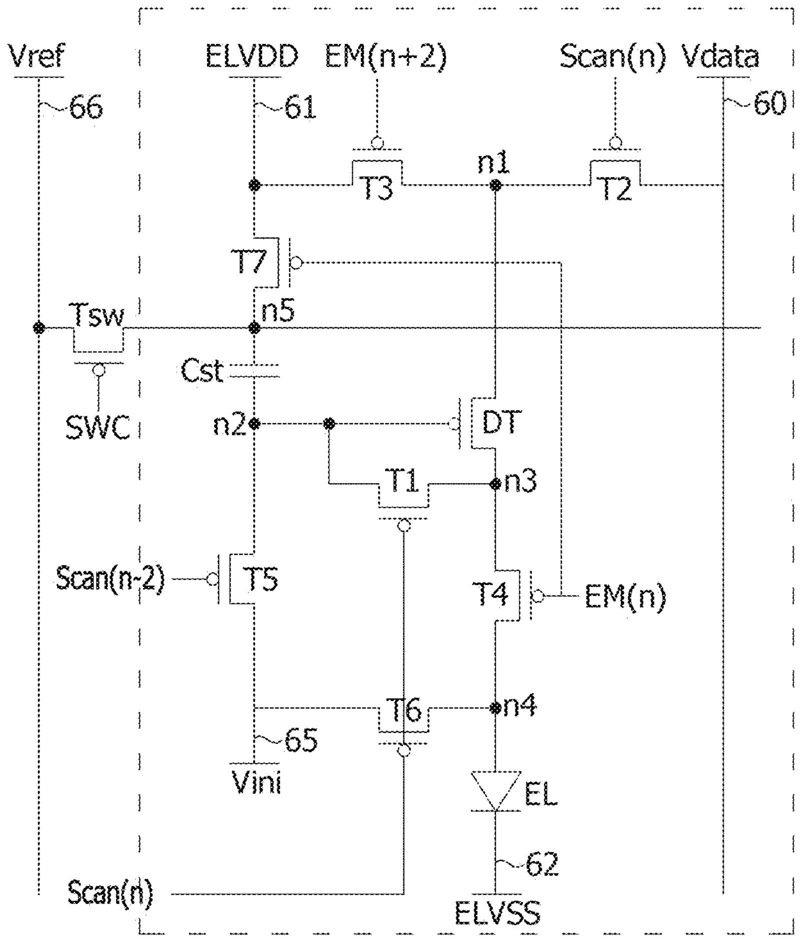
FIG. 14 is a diagram illustrating the pixel circuit according to a third embodiment of the present disclosure.
Figure 15:
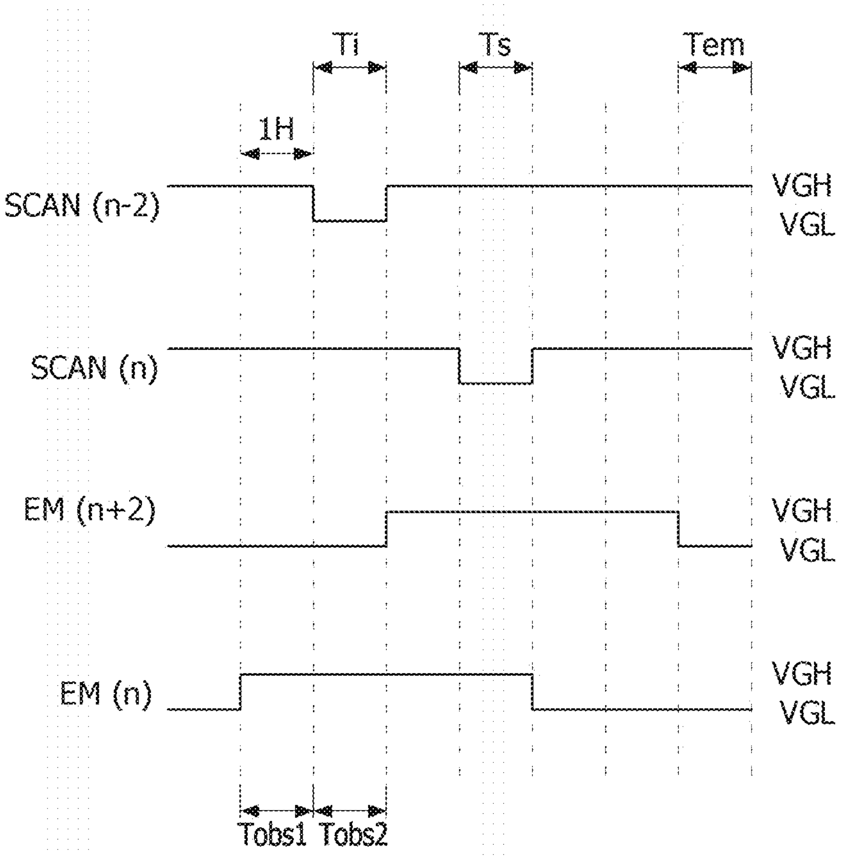
FIG. 15 is a diagram illustrating a driving timing of the pixel circuit shown in FIG. 14 according to the third embodiment of the present disclosure.
Figure 16A:
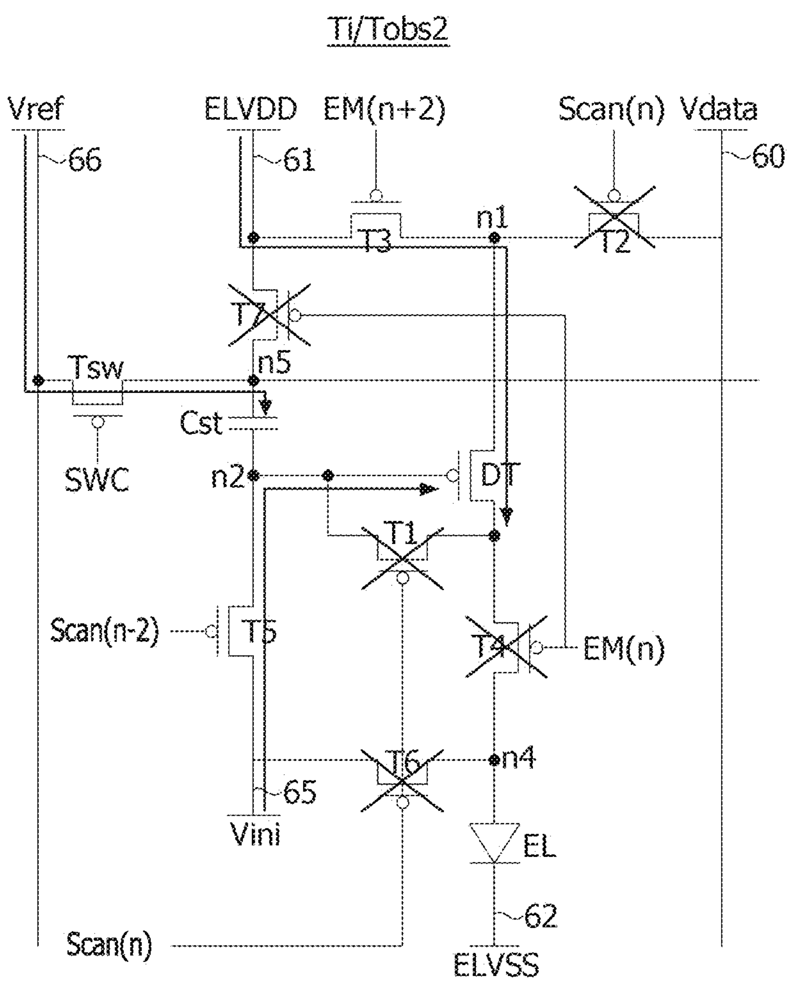
FIGS. 16A to 16C are diagrams illustrating an operation principle of the pixel circuit shown in FIG. 15 according to the third embodiment of the present disclosure.
Figure 16B:
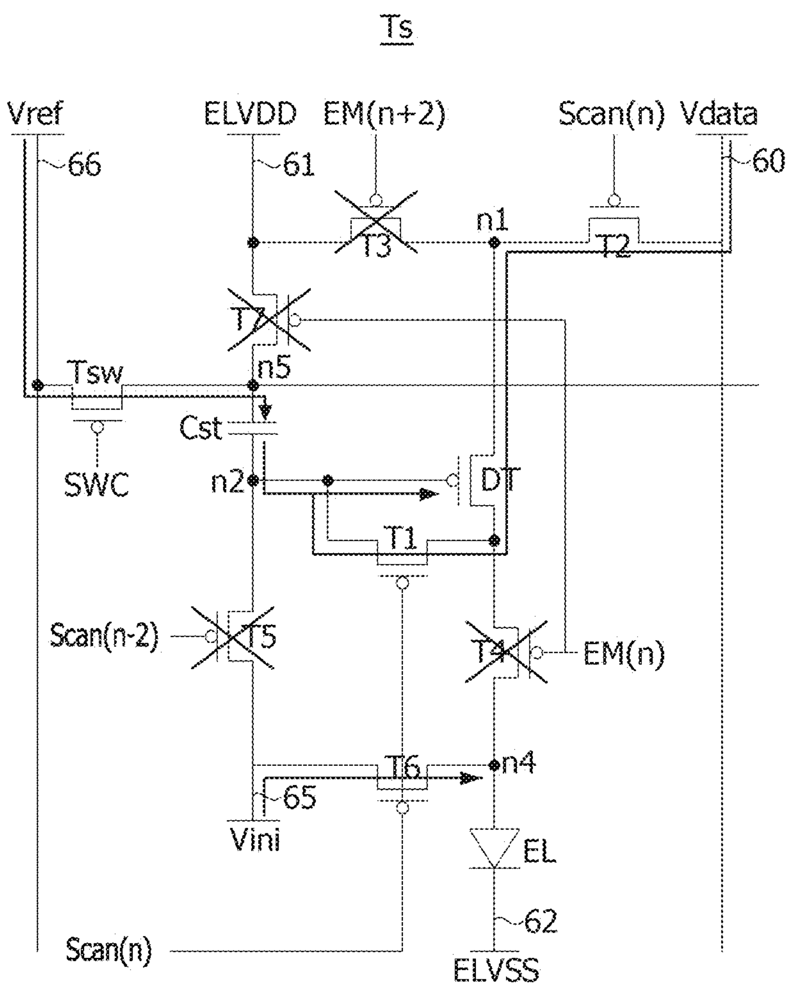
Figure 16C:
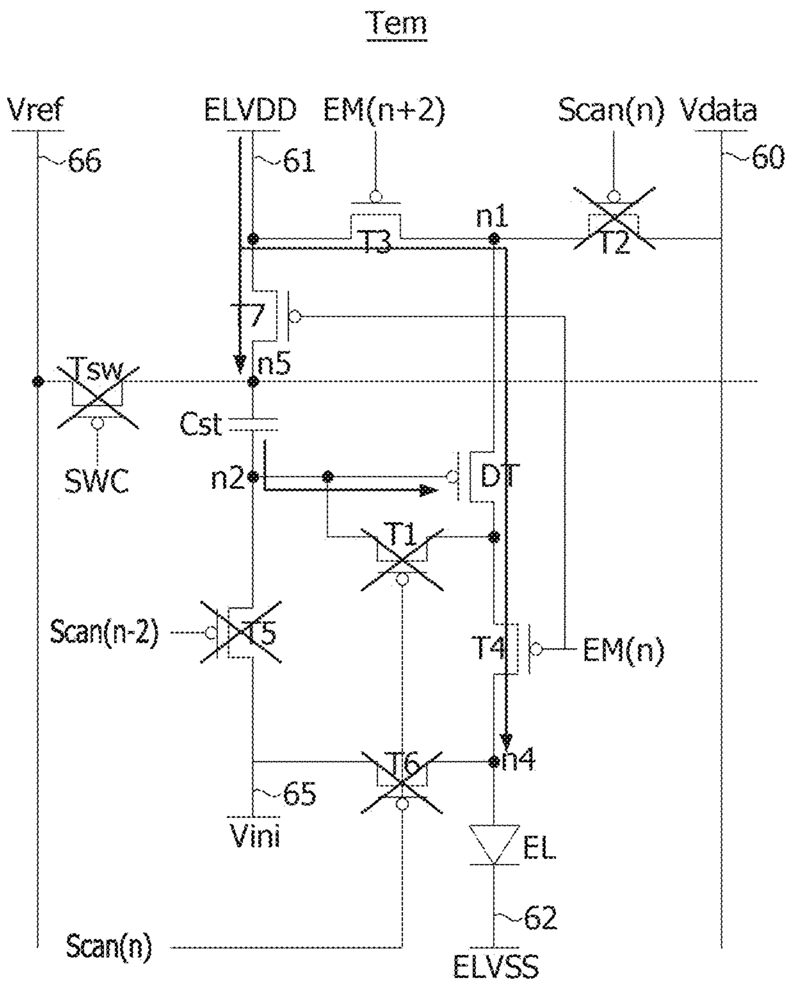

FIG. 14 is a diagram illustrating the pixel circuit according to a third embodiment of the present disclosure, FIG. 15 is a diagram illustrating a driving timing of the pixel circuit shown in FIG. 14 according to the third embodiment of the present disclosure, and FIGS. 16A to 16C are diagrams illustrating an operation principle of the pixel circuit shown in FIG. 15 according to the third embodiment of the present disclosure.

Referring to FIG. 14, the pixel circuit according to the third embodiment of the present disclosure includes a light-emitting element EL, a driving element DT supplying a current to the light-emitting element EL, a plurality of switch elements T1, T2, T3, T4, T5, T6, and T7 for switching a current path connected to the driving element DT, and a capacitor Cst for storing a gate-source voltage of the driving element DT. The driving element DT and the switch elements T1, T2, T3, T4, T5, T6, and T7 may be implemented as P-channel LTPS TFTs.

The capacitor Cst is connected between the second node n2 and the fifth node n5. The first electrode of the capacitor Cst is connected to the fifth node n5, and the second electrode is connected to the second node n2. The second node n2 is connected to the gate electrode of the driving element DT, the second electrode of the capacitor Cst, and the first electrode of the fifth switch element T5. The fifth node n5 is connected to the second electrode of the seventh switch element T7 and the first electrode of the capacitor Cst.

The first switch element T1 is turned on according to the gate-on voltage VGL of the second scan signal SCAN(n) to connect the gate electrode and the second electrode of the driving element DT. The first switch element T1 includes a gate electrode to which the second scan signal SCAN(n) is applied, a first electrode connected to the second node n2, and a second electrode connected to the third node n3. The third node n3 is connected to the second electrode of the driving element DT, the second electrode of the first switch element T1, and the first electrode of the fourth switch element T4.

The second switch element T2 is turned on according to the gate-on voltage VGL of the second scan signal SCAN(n) to apply the data voltage Vdata to the first electrode of the driving element DT. The second switch element T2 includes a gate electrode to which the second scan signal SCAN(n) is applied, a first electrode connected to the first node n1, and a second electrode connected to the data line 60. The first node n1 is connected to the first electrode of the driving element DT, the first electrode of the second switch element T2, and the second electrode of the third switch element T3.

The third switch element T3 supplies the pixel driving voltage ELVDD to the first node n1 in response to the first EM signal EM(n+2). The third switch element T3 includes a gate electrode to which the first EM signal EM(n+2) is applied, a first electrode connected to the pixel driving voltage line 61, and a second electrode connected to the first node n1.

The fourth switch element T4 is turned on according to the gate-on voltage VGL of the second EM signal EM(n) to connect the second electrode of the driving element DT to the anode of the light-emitting element EL. The fourth switch element T4 includes a gate electrode to which the second EM signal EM(n) is applied, a first electrode connected to the third node n3, and a second electrode connected to the fourth node n4. The fourth node n4 is connected to the anode electrode of the light-emitting element EL, the second electrode of the fourth switch element T4, and the second electrode of the sixth switch element T6.

The fifth switch element T5 is turned on according to the gate-on voltage VGL of the first scan signal SCAN(n−2) so as to connect the second node n2 to the initialization voltage line 65, thereby initializing the capacitor Cst and the gate of the driving element DT during the initialization step Ti. The fifth switch element T5 includes a gate electrode to which the first scan signal SCAN(n−2) is applied, a first electrode to which the second node n2 is connected, and a second electrode to which the initialization voltage line 65 is connected.

The sixth switch element T6 is turned on according to the gate-on voltage VGL of the second scan signal SCAN(n) so as to connect the initialization voltage line 65 to the anode of the light-emitting element EL during the initialization step Ti. During the initialization step Ti, the anode voltage of the light-emitting element EL is discharged to the initialization voltage Vini through the sixth switch element T6. In this case, the light-emitting element EL does not emit light because the voltage between the anode and the cathode is lower than its threshold voltage. The sixth switch element T6 includes a gate electrode to which the second scan signal SCAN(n) is applied, a first electrode to the initialization voltage line 65, and a second electrode to the fourth node n4.

The seventh switch element T7 supplies the pixel driving voltage ELVDD to the capacitor Cst in response to the second EM signal EM(n). The seventh switch element T7 includes a gate electrode to which the second EM signal EM(n) is applied, a first electrode connected to the pixel driving voltage line 61, and a second electrode connected to the fifth node n5.

A reference voltage line 66 to which the reference voltage Vref is applied and a control switch element Tsw to apply the reference voltage Vref to the fifth node n5 through the reference voltage line 66 may be further connected to the fifth node n5 of the pixel circuit.

The control switch element Tsw may be disposed inside the display panel 100 and may be disposed outside the active area. The control switch element Tsw may be disposed for each pixel line to be controlled for each pixel line, or may be disposed to divide the display panel 100 into a plurality of pixel blocks to be controlled for each pixel block.

The control switch element Tsw may receive a control signal from a timing controller. For example, the timing controller generates and outputs a control signal of a first voltage level, and the level shifter receives a control signal of a first voltage level to generate a control signal of a second voltage level higher than the first voltage level and apply it to the control switch element Tsw.

The reference voltage Vref applied to the pixel circuit is used to improve the influence of the voltage drop IR drop of the pixel driving voltage ELVDD in the pixel circuit. That is, the current flowing by the light-emitting element is not IOLED=K(ELVDD−Vdata)2 but IOLED=K(Vref−Vdata)2. Accordingly, in one or more embodiments, the reference voltage Vref is applied instead of the pixel driving voltage ELVDD to the fifth node n5 to which the capacitor is connected in the initialization and sampling steps.

The pixel circuit according to the third embodiment is driven in the order of a first OBS step Tobs, a second OBS step Tobs, an initialization step Ti, a sampling step Ts, and a light emission step Tem as illustrated in FIG. 15.

In the first OBS step Tobs1 before the initialization step Ti, the first switch element T1, the second switch element T2, the fourth switch element T4, the fifth switch element T5, the sixth switch element T6, and the seventh switch element T7 are turned off, and the third switch element T3 is turned on by the first EM signal EM(n+2) to supply the pixel driving voltage ELVDD to the first electrode of the driving element DT.

In the initialization step Ti of FIG. 16A, the first switch element T1, the second switch element T2, the fourth switch element T4, the sixth switch element T6, and the seventh switch element T7 are turned off, and the fifth switch element T5 is turned on by the first scan signal SCAN(n−2), so that the voltage of the second node n2 is discharged to the initialization voltage Vini.

At the same time, in the second OBS step Tobs2, the third switching element T3 is turned on by the first EM signal [EM(n+2)] to supply the pixel driving voltage ELVDD to the first electrode of the driving element DT.

In this case, the initialization step Ti is performed at the same timing as the second OBS step Tobs2. Therefore, the voltage of the second node n2 becomes Vg=Vini, the voltage of the first node n1 becomes Vs=ELVDD, and thus a source-gate voltage of the driving element becomes Vsg=ELVDD−Vini.

In addition, the control switch element Tsw is turned on so that the reference voltage Vref is supplied to the fifth node n5.

In the sampling step Ts of FIG. 16B, the third switch element T3, the fourth switch element T4, the fifth switch element T5, and the seventh switch element T7 are turned off, and the first switch element T1 and the second switch element T2 are turned on by the second scan signal SCAN (n), so that a data voltage Vdata is applied to the first node n1 and the second node n2, and the sixth switch element T6 is turned on to apply an initialization voltage Vini to the fourth node n4. Accordingly, the voltage of the second node n2 becomes Vg=Vdata−|Vth|, and the voltage of the first node n1 becomes Vs=Vdata, so that a source-gate voltage of the driving element becomes Vsg=|Vth|.

Also, the control switch element Tsw is turned on so that the reference voltage Vref is supplied to the fifth node n5.

In the light emission step Tem of FIG. 16C, the first switch element T1, the second switch element T2, the fifth switch element T5, and the sixth switch element T6 are turned off, the fourth switch element T4 is turned on by the second EM signal EM(n) and the third switch element T3 is turned on by the first EM signal EM(n+2), so that a current flows through the light-emitting element EL through the driving element DT to emit light. Accordingly, the voltage of the second node n2 becomes Vg=Vdata−|Vth|+(ELVDD−Vref), and the voltage of the first node n1 becomes Vs=ELVDD, so that the source-gate voltage of the driving element becomes Vsg=Vref−Vdata+|Vth|.

At this time, the control switch element Tsw is turned off to cut off the supply of the reference voltage Vref.

As such, in the third embodiment of the present disclosure, FFR improvement may be possible by realizing OBS driving using the pixel driving voltage ELVDD without separate voltage, control TFT, and timing control.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure.

What is claimed is:

1. A pixel circuit, comprising:

a driving element including a first electrode connected to a first node of the pixel circuit, a gate electrode connected to a second node of the pixel circuit, and a second electrode connected to a third node of the pixel circuit;

a first switch element connecting the second node to the third node in response to a first gate signal;

a second switch element applying a data voltage to the first node in response to a second gate signal;

a third switch element connecting a pixel driving voltage line of the pixel circuit to the first node in response to a third gate signal;

a fourth switch element connecting the third node to a fourth node of the pixel circuit in response to the third gate signal;

a fifth switch element applying a first initialization voltage to the second node in response to a fourth gate signal;

a sixth switch element applying a second initialization voltage to the fourth node in response to the second gate signal;

a capacitor connected to the pixel driving voltage line and the second node; and a light-emitting element connected to the fourth node and a low potential power voltage line of the pixel circuit.

2. The pixel circuit of claim 1, wherein:

the pixel circuit is driven in an order of an initialization step, an on-bias stress (OBS) step, a sampling step, and a light emission step, in the initialization step, the fifth switch element is turned and a voltage of the second node is discharged to the first initialization voltage, and the sixth switch element is turned on and a voltage of the fourth node is discharged to the second initialization voltage, and in the OBS step, the second switch element is turned on and the data voltage of a previous frame is applied to the first node.

3. The pixel circuit of claim 2, wherein, in the sampling step, both the first switch element and the second switch element are turned on and the data voltage of a current frame is applied to the first node.

4. A display device, comprising:

a pixel array with a plurality of data lines, a plurality of gate lines, and a plurality of pixel circuits;

a data driver outputting a data voltage to the plurality of data lines; and a gate driver outputting gate signals to the plurality of gate lines, wherein each of the plurality of pixel circuits comprises:

a driving element including a first electrode connected to a first node of the pixel circuit, a gate electrode connected to a second node of the pixel circuit, and a second electrode connected to a third node of the pixel circuit;

a first switch element connecting the second node to the third node in response to a first gate signal;

a second switch element applying the data voltage to the first node in response to a second gate signal;

a third switch element connecting a pixel driving voltage line to the first node in response to a third gate signal;

a fourth switch element connecting the third node to a fourth node in response to the third gate signal;

a fifth switch element applying a first initialization voltage to the second node in response to a fourth gate signal;

a sixth switch element applying a second initialization voltage to the fourth node in response to the second gate signal;

a capacitor connected to the pixel driving voltage line and the second node; and a light-emitting element connected to the fourth node and a low potential power voltage line.

5. The display device of claim 4, wherein:

each of the plurality of pixel circuits is driven in an order of an initialization step, an on-bias stress (OBS) step, a sampling step, and a light emission step, in the initialization step, the fifth switch element is turned on and a voltage of the second node is discharged to the first initialization voltage, and the sixth switch element is turned on and a voltage of the fourth node is discharged to the second initialization voltage, and in the OBS step, the second switch element is turned on and the data voltage of a previous frame is applied to the first node.

6. The display device of claim 5, wherein, in the sampling step, both the first switch element and the second switch element are turned on and the data voltage of a current frame is applied to the first node.

* * * * *